United States Patent [19]

Masuda et al.

[11] Patent Number: 4,988,850
[45] Date of Patent: Jan. 29, 1991

[54] MAGNETORESISTANCE ELEMENT ARRAY

[75] Inventors: Noboru Masuda, Saitama; Tetsuo Oosawa, Tokyo; Kenji Tomaki, Kanagawa, all of Japan

[73] Assignee: Murata Mfg. Co., Ltd., Kyoto, Japan

[21] Appl. No.: 353,447

[22] Filed: May 17, 1989

[30] Foreign Application Priority Data

May 25, 1988 [JP] Japan .............................. 63-69030[U]
May 27, 1988 [JP] Japan .............................. 63-70067[U]

[51] Int. Cl.$^5$ .............................................. G06K 7/08
[52] U.S. Cl. ..................................... 235/449; 360/113
[58] Field of Search ................... 235/449, 450; 360/113

[56] References Cited

U.S. PATENT DOCUMENTS

| | | | |
|---|---|---|---|
| 3,932,731 | 1/1976 | Moore | 360/113 X |
| 4,079,360 | 3/1978 | Ookubo et al. | 235/449 X |
| 4,197,987 | 4/1980 | Lazzari | 360/113 X |
| 4,354,100 | 10/1982 | Rohen | 235/449 |
| 4,523,243 | 6/1985 | Billington | 235/449 X |
| 4,827,218 | 5/1989 | Meunier et al. | 235/450 X |

Primary Examiner—David Trafton
Attorney, Agent, or Firm—Koda and Androlia

[57] ABSTRACT

Disclosed is a small-sized magnetoresistance element array having a plurality of arranged magnetoresistance elements and provided with excellent operating efficiency which facilitates connection of each magnetoresistance element by virtue of comb terminals and U-shaped terminals provided on the inner walls of the stem. In the magnetoresistance element array, the magnet detectors are positioned at the right three-dimensional position, thereby preventing crosstalk or deviation in the reading timing at the time of reading a magnetic code. Guides are provided on the top walls of the stem so as to regulate the position at which the magnetic detector is secured to the top portion of the magnet.

The magnetoresistance element array is used for a magnetic sensor for reading information recorded as a magnetic code from a magnetic code recorded medium such as a magnetic card.

18 Claims, 7 Drawing Sheets

MAGNETORESISTANCE ELEMENT ARRAY

BACKGROUND OF THE INVENTION

1. Field of the Invention

The present invention relates to a magnetoresistance element array composed of a plurality of arranged magnetoresistance elements.

2. Description of the Prior Art

A magnetic sensor for reading an information code (magnetic code) formed on a magnetic card is provided with a magnetoresistance element array.

For example, a magnetic sensor for reading a magnetic code in the magnetic dots which are arranged in a matrix of n rows×m lines on a magnetic card contains a magnetoresistance element array having the same number of magnetic detectors as the rows (n) or the lines (m). When the magnetic card passes by the magnetoresistance element array with a predetermined space therebetween in a predetermined direction, the magnetic sensor containing the magnetoresistance element array detects the information recorded on the magnetic card in the form of a magnetic code, and outputs as an electric signal to the output terminal.

Similarly, a sensor for reading magnetic codes formed on printed matter in magnetic ink such as bank notes is also provided with a magnetoresistance element array.

FIG. 1 shows a general structure of such kind of magnetoresistance element array. In FIG. 1, a stem 10 consisting of a rectangular box body is provided with a plurality of through holes 12 for receiving magnets at regular intervals in the longitudinal direction (the direction of Y in FIG. 1). A magnet 14 is inserted into each of the through holes 12 and fixed in the state in which the top portion of the magnet 14 protrudes toward the upper surface of the stem 10. To the center of the top portion of each magnet 14, an element substrate 18 of a magnetic detector 16 is secured by an adhesive or the like, and a first magnetoresistance element 20 and a second magnetoresistance element 22 are formed on the surface of the element substrate 18. Each of the first and second magnetoresistance elements 20 and 22 is composed of indium antimony or the like and the resistance value varies in accordance with the magnetic field applied thereto. Power source terminals 24 and 26 and output terminals 28 and 30 are provided for each of the magnetoresistance elements 20 and 22, respectively, and these terminals 24, 26, 28 and 30 are connected to pins 32, 34, 36 and 38, respectively, which are disposed in the vicinity of the magnet 14.

The connection of the magnetoresistance element array is shown in FIG. 2. The pins 32 and 34 are connected to the hot line and the cold line, respectively, of the power source. The other magnetic detectors 16 are connected to the power source in the same way. Thus, the magnetic detectors 16 are connected in parallel to each other with respect to the power source.

The pins 36 and 38 are connected to the output terminal. When a magnetic code recorded medium such as a magnetic card passes by the magnetic detector 16 in parallel thereto and with a predetermined space therebetween, the magnetic field produced by the magnet 14 is disturbed and the resistance value of the magnetoresistance elements 20 and 24 changes. The change in the resistance value is output to the output terminal as a detection signal through the pins 36 and 38. The required number of magnetic detectors 16 are provided and, hence, the magnetoresistance element array is provided with the same number of outputs.

In order to realize the connection shown in FIG. 2, a printed circuit board 39 shown in FIG. 3 is used. On the printed circuit board 39, printed conductors 40, 42 of a power source and a printed output terminal 44 are formed from a conductive material. The pin 32 is connected to the printed conductor 40 through the printed circuit board 39. Similarly, the pin 34 is connected to the printed conductor 42. To the output terminal 44, the pins 36 and 38 are connected. In this way, the power source terminal 24 of the first magnetoresistance element 20 is connected to the hot line of the power source, and the power source terminal 26 of the second magnetoresistance element 22 is connected to the cold line of the power source. Conduction is established on the output terminals 28, 30 of a pair of magnetoresistance elements 20, 22 of each channel by the output terminal 44 through the pins 36 and 38, respectively, and the output signal of each channel is taken out of the terminal 44 through a lead wire 46.

According to a conventional magnetoresistance element array having the above-described structure, when a magnetic card is passed by the surface side of the stem 10, for example, a read signal such as a magnetic code of each channel is lead to a signal processing unit of a computer or the like through the lead wire 46, thereby enabling a desired signal processing.

In such a conventional magnetoresistance element array, however, since the magnetic detector 14 is bonded to the top surface of the magnet 12 at the position estimated with the eye, it is difficult to bond the magnetic detector 16 to the center of the top portion of the magnet 14 at the right three-dimensional position. For example, it is difficult to prevent the magnetic detector 16 from deviating from the right position in the direction of Y which makes the spaces between the adjacent magnetic detectors 16 irregular, or in the direction of X, and the magnetic detector 16 from being disposed aslant. This inconvenience causes a trouble at the time of reading a magnetic code such as crosstalk between the adjacent channels and deviation in the reading timing in each channel. Thus, the conventional magnetoresistance element array has a problem in the reliability of reading.

In addition, since the above-described conventional magnetoresistance element array requires the printed circuit board 39 for connecting the magnetoresistance elements 20 and 22, and each of the terminals 24, 26, 28 and 30 of the magnetoresistance elements 20 and 22 is connected to the corresponding conductors of the printed circuit board 39 through the pins 32, 34, 36 and 38, respectively, these connecting operations become complicated, thereby lowering the operating efficiency. Since the printed circuit board 39 is necessary, the cost for the apparatus is raised and the size thereof must be enlarged disadvantageously.

SUMMARY OF THE INVENTION

Accordingly, it is an object of the present invention to eliminate the above-described problems in the prior art and to provide a magnetoresistance element array provided with magnetic detectors each of which is disposed at the center of a magnet at the right three-dimensional position, and having high reliability which precludes the possibility of producing crosstalk or deviation in the reading timing at the time of reading a magnetic code.

It is another object of the present invention to provide a small-sized magnetoresistance element array with excellent operating efficiency which facilitates connection of each magnetoresistance element by a simple structure which is dispensed with a printed circuit board and a pin.

To achieve this aim, a magnetoresistance element array according to the present invention has the following structure.

The magnetoresistance element array has top walls each of which protrudes from partitioned walls of a stem in such a manner as to connect the side walls of the stem in the longitudinal direction like a bridge. The top portion of a magnet is brought into close contact with the underside of the top wall. The magnetoresistance element array has guides which protrude from a pair of opposing top walls in such a manner as to constitute a guide gap therebetween which is substantially equal to the width of a magnetic detector. The guides regulate the position at which the magnet detector is secured to the top portion of the magnet.

The guide includes a regulating side which is substantially equal to the length of the element substrate of the magnetic detector The element substrate of the magnetic detector is closely inserted between the corresponding regulating sides, whereby the position at which the magnet detector is secured to the top portion of the magnet is regulated.

The guide has a larger thickness than the magnetic detector. The upper surface of the guide is located above the upper surface of the magnet detector The magnet is bonded to the stem by an adhesive. The top wall has a top wall groove and a through hole through which a surplus adhesive is discharged.

The magnetoresistance element array is provided with a pair of comb terminals each of which has a plurality of leg portions arranged and a handle portion for connecting the leg portions, and which are disposed along the two side walls of the stem so as to be connected to the power source terminals of the magnetic detectors. The comb terminals connect the power source terminals of the magnetic detectors to the power source in parallel to each other.

The magnetoresistance element array is also provided with a plurality of U-shaped terminals disposed along the partition walls and connected to the output terminals of the magnetoresistance elements formed on the respective magnetic detectors. The U-shaped terminal outputs the detected value of the magnetic detector to the outside.

The stem is provided with overhang portions which protrude from the outer side walls. The overhang portion has the same thickness as an array holder and secures the stem to the array holder.

Terminal receiving grooves for receiving the comb terminals and the U-shaped terminals are provided on the inner side walls of the stem. Terminal receiving recessed portions for receiving the wider areas of the comb terminals and the U-shaped terminals which are connected to the power source terminals and the output terminals, respectively, of the magnetoresistance elements are provided on the overhang portions of the stem.

The power terminals and the output terminals of the magnetic detector constitute frame leads. The lead-out ends of the power source terminals and the output terminals which are connected to the comb terminals and the U-shaped terminals, respectively, are positioned at the terminal receiving recessed portions.

Positioning grooves are provided on the outer side walls of the stem. The positioning grooves regulate the position at which the stem is secured to the array holder.

The magnetoresistance element array includes a magnet provided with grooves on the side surfaces thereof On the inner walls of the stem, rib-like partition walls are provided and the grooves of the magnet engages with the rib-like partition walls.

According to a magnetoresistance element array having the above-described structure, it is possible to prevent crosstalk or deviation in the reading timing at the time of reading a magnetic code. More specifically, the guides provided on the top walls in such a manner as to have regulating sides which position each magnetic detector at a predetermined position on the stem, whereby the magnetic detectors read a magnetic code and output the detection signals without producing crosstalk or deviation in the reading timing when a magnetic card and a magnetic code recorded medium such as a bank note printed in magnetic ink passes by the surface of the magnetoresistance element array on which the magnetic detectors are disposed with a predetermined space therebetween.

According to the magnetoresistance element array of the present invention, it is possible to connect between magnetoresistance elements or between the magnetoresistance element and the power source by the U-shaped terminals and the comb terminals, respectively, with easiness and at a low cost. It is therefore possible to produce a small-sized magnetoresistance element array.

In addition, by virtue of the terminal receiving recessed portions and the guides thicker than the magnetic detector, it is possible to keep the detecting sensitivity constant at the time of reading a magnetic code by regulating the gap between the magnetic code recorded medium and the magnetic detector in the state in which the magnetic detector and the terminals thereof do not protrude from the surface on which the magnetic detector is disposed. By virtue of the top wall groove and the through hole, it is possible to prevent the adhesive for bonding the stem and the magnet from protruding from the surface on which the magnetic detector is disposed, thereby keeping the detecting sensitivity constant. Since the terminals of the magnetic detector constitute frame leads, the connection between the comb terminals and the U-shaped terminals and the magnetic detector is facilitated by bonding.

The overhang portions and the positioning grooves regulate the position at which the magnetoresistance element array is secured to the array holder and since the thicknesses of the overhang portion and the array holder are the same, it is possible to secure the magnetoresistance element array to the array holder accurately and easily.

By virtue of the grooves of the magnet and the rib-like partition walls, the stem is capable of holding the magnet with higher reliability.

The above and other objects, features and advantages of the present invention will become clear from the following description of the preferred embodiments thereof, taken in conjunction with the accompanying drawings.

DESCRIPTION OF THE PREFERRED EMBODIMENTS

Embodiments of the present invention will be explained hereinunder with reference to the accompanying drawings.

FIGS. 4 to 7 show the structure of an embodiment of a magnetoresistance element array according to the present invention.

Figure 1:
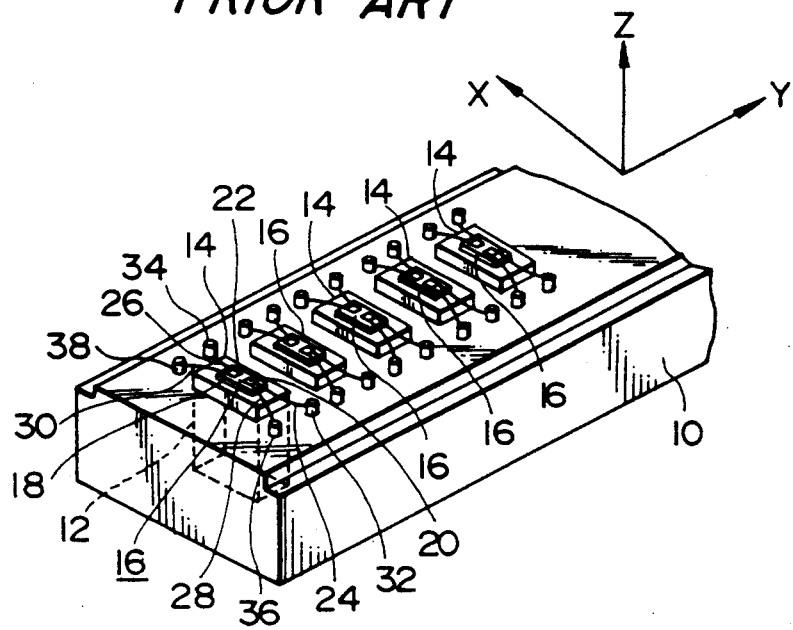
FIG. 1 is a cutaway perspective view of a conventional magnetoresistance element array, showing the surface thereof on which magnetic detectors are disposed in order to explain the structure of the magnetoresistance element array.
Figure 2:
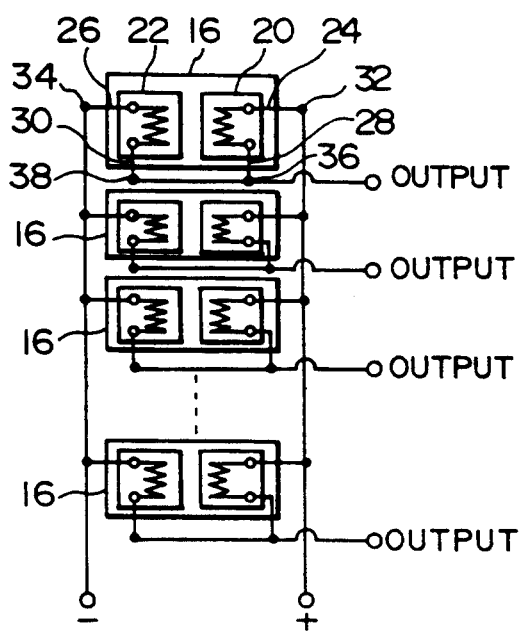
FIG. 2 is a circuit diagram which shows the connection of the conventional magnetoresistance elements shown in FIG. 1, wherein the connection between the magnetoresistance element and the power source and the connection between the magnetoresistance element and the output terminals are shown.
Figure 3:
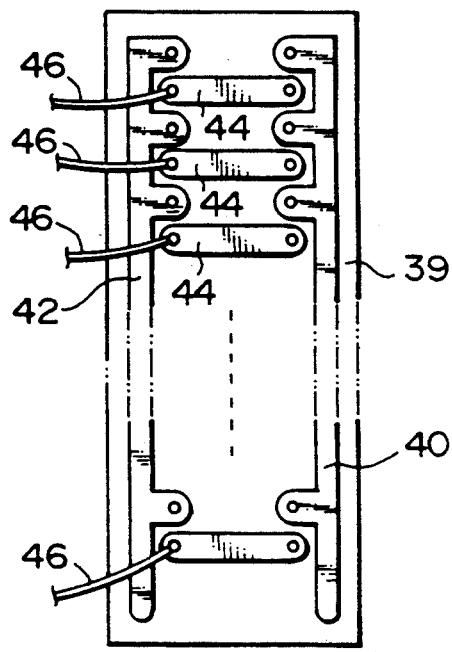
FIG. 3 is a plan view of the patterns of a printed circuit board for realizing the connection shown in FIG. 2, the patterns including the patterns for the connection to the positive terminal of the power source and the negative terminal of the power source and the pattern for outputting a detection output to the outside.
Figure 4:
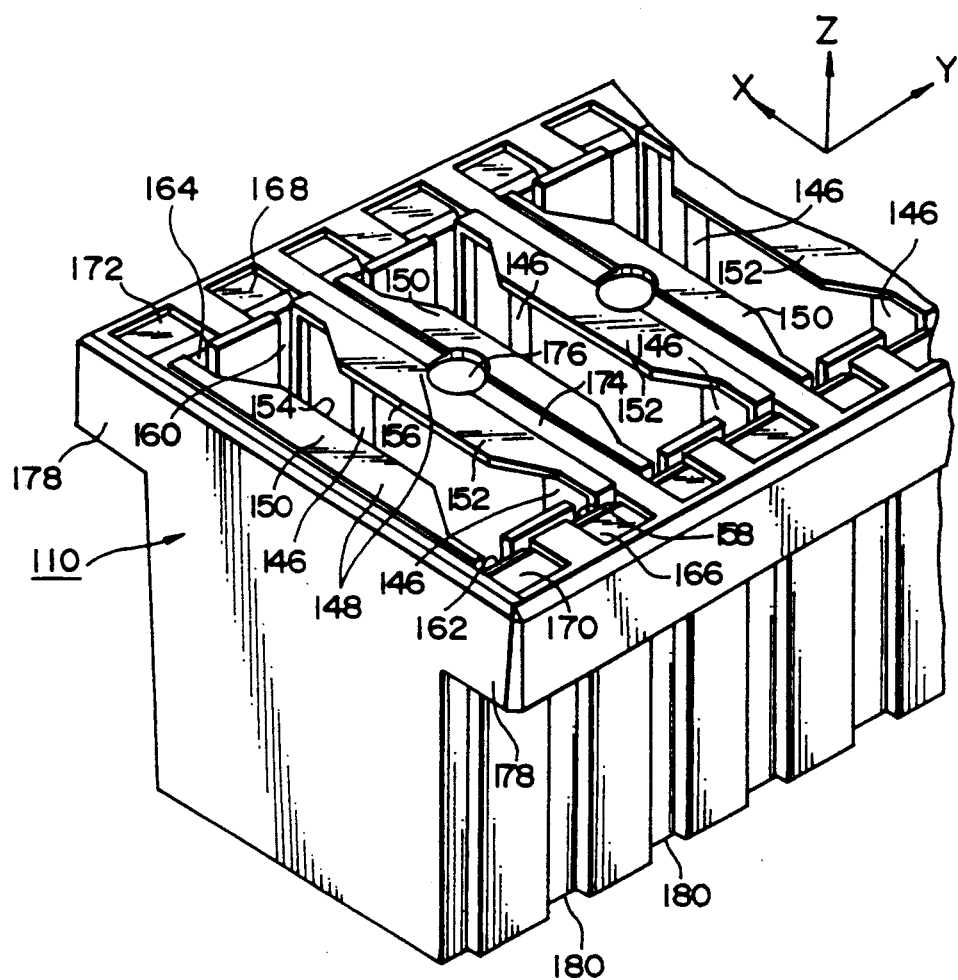
FIG. 4 is a cutaway perspective view of a stem used for a first embodiment of a magnetoresistance element array according to the present invention, showing the surface on which guides characteristic of the present invention are provided.

In FIG. 4, a stem 110 is formed of a plastic material into a shape of a rectangular box by injection molding, thereby constituting a rectangular hollow container. Rib-like partition walls 146 are provided on the longitudinal inner side walls of the stem 110 with a predetermined space therebetween in such a manner as to protrude inwardly in the direction orthogonal to the side walls.

Each pair of opposed top walls 148 of the stem 110 are provided with a pair of trapezoidal plate-like guides 150 and 152 each of which protrudes from the top wall 148 toward the opposite top wall 148. The space between the guides 150 and 152 which are characteristic of the present invention is equal to or slightly larger than the width of a magnetic detector 116 which will be described later. The length of the regulating sides 154 and 156 of the guides 150 and 152, respectively, is equal to the length of the magnetic detector 116. The guides 150 and 152 have a thickness larger than the magnetic detector 116.

The stem 110 is provided with overhang portions 178 which project from the outer side walls in the widthwise direction (detection of X in FIG. 4).

Terminal receiving grooves 158, 160, 162 and 164 are provided on the inner side walls of the stem 111. Terminal receiving recessed portions 166, 168, 170 and 172 are provided on the top surfaces of the overhang portions 178 in such a manner as to continue from the terminal receiving grooves 158, 160, 162 and 164, respectively. In this embodiment, a top wall groove 174 extending along the top wall 148 in the widthwise direction of the stem 110 (the direction of X in FIG. 4) is provided. At the center of the top wall groove 174, a through hole 176 is formed. By virtue of the top wall groove 174 and the through hole 176, it is possible to prevent the generation of deformation such as warping and shrinkage on the stem 110 when it is produced by, for example, injection molding.

Positioning grooves 180 are further provided on the outer walls of the stem 110.

Figure 5:
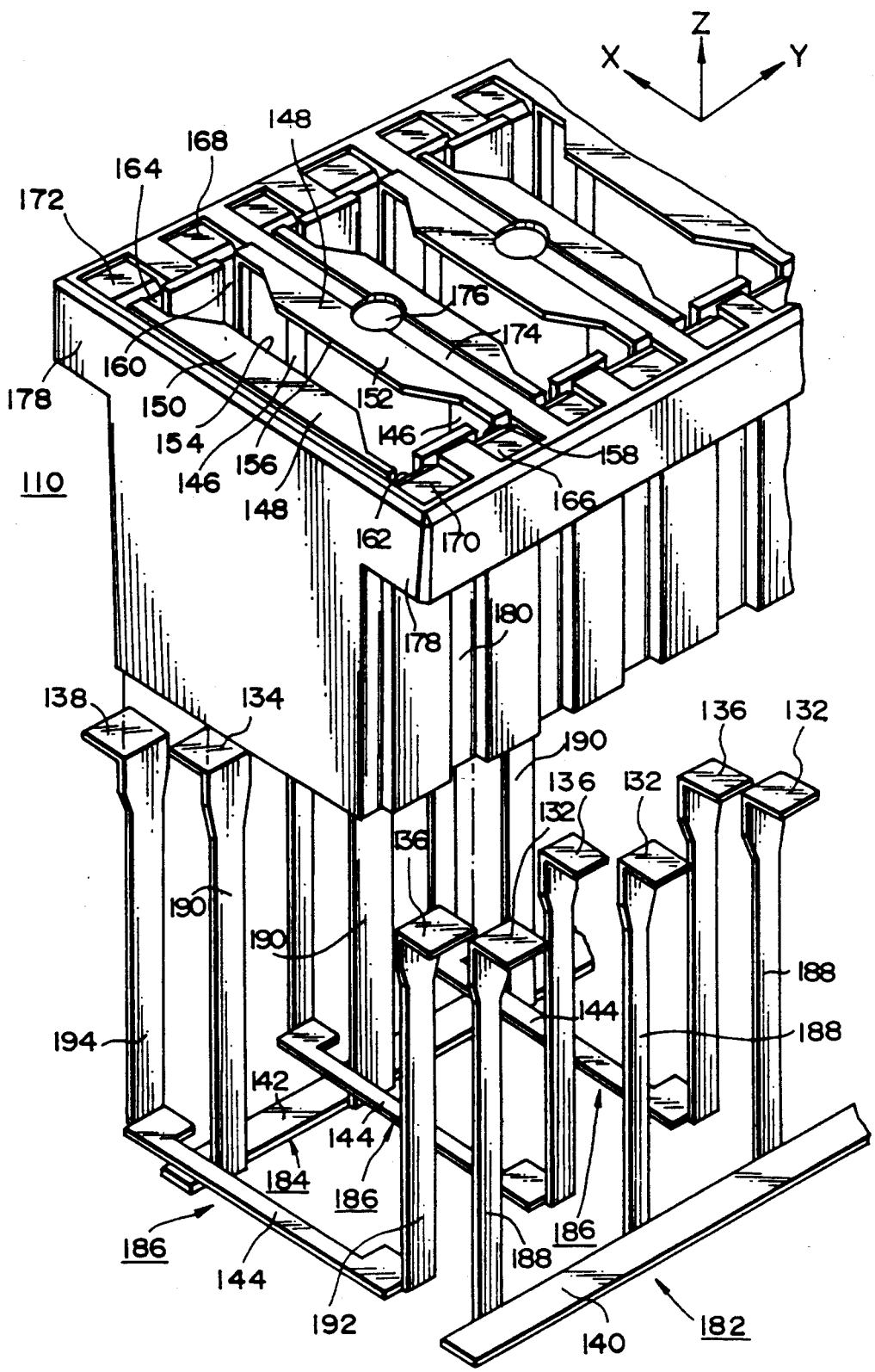
FIG. 5 is a cutaway perspective view of the stem shown in FIG. 4, explaining the state in which comb terminals and U-shaped terminals characteristic of the present invention are attached to the stem.

FIG. 5 is a cutaway perspective view of the stem 110 shown in FIG. 4, explaining the state in which comb terminals 182, 184 and U-shaped terminals 186 which are characteristic of the present invention are attached to the stem 110.

The comb terminals 182, 184 are composed of wider areas 132, 134, leg portions 188, 190 and handle portions 140, 142, respectively. The U-shaped terminal 186 is composed of wider areas 136 and 138, leg portions 192 and 194 and a handle portion 144.

The terminal receiving grooves 158, 160, 162 and 164 are provided on the side walls of the stem 110, as described above, and the terminal receiving recessed portions 166, 168, 170 and 172 are provided on the top surfaces of the overhand portions 178 in such a manner as to continue from the respective grooves.

The leg portions 192 and 194 of the U-shaped terminal 186 are inserted into the terminal receiving grooves 162 and 164, respectively, and the leg portions 188 and 190 of the comb terminals 182 and 184, respectively, are inserted into the terminal receiving grooves 166 and 168, respectively. The terminal receiving recessed portions 166, 168, 170 and 172 receive the wider areas 136, 138, 132 and 134, respectively, of the comb terminals 182 and 184, and the U-shaped terminal 186.

Figure 6:
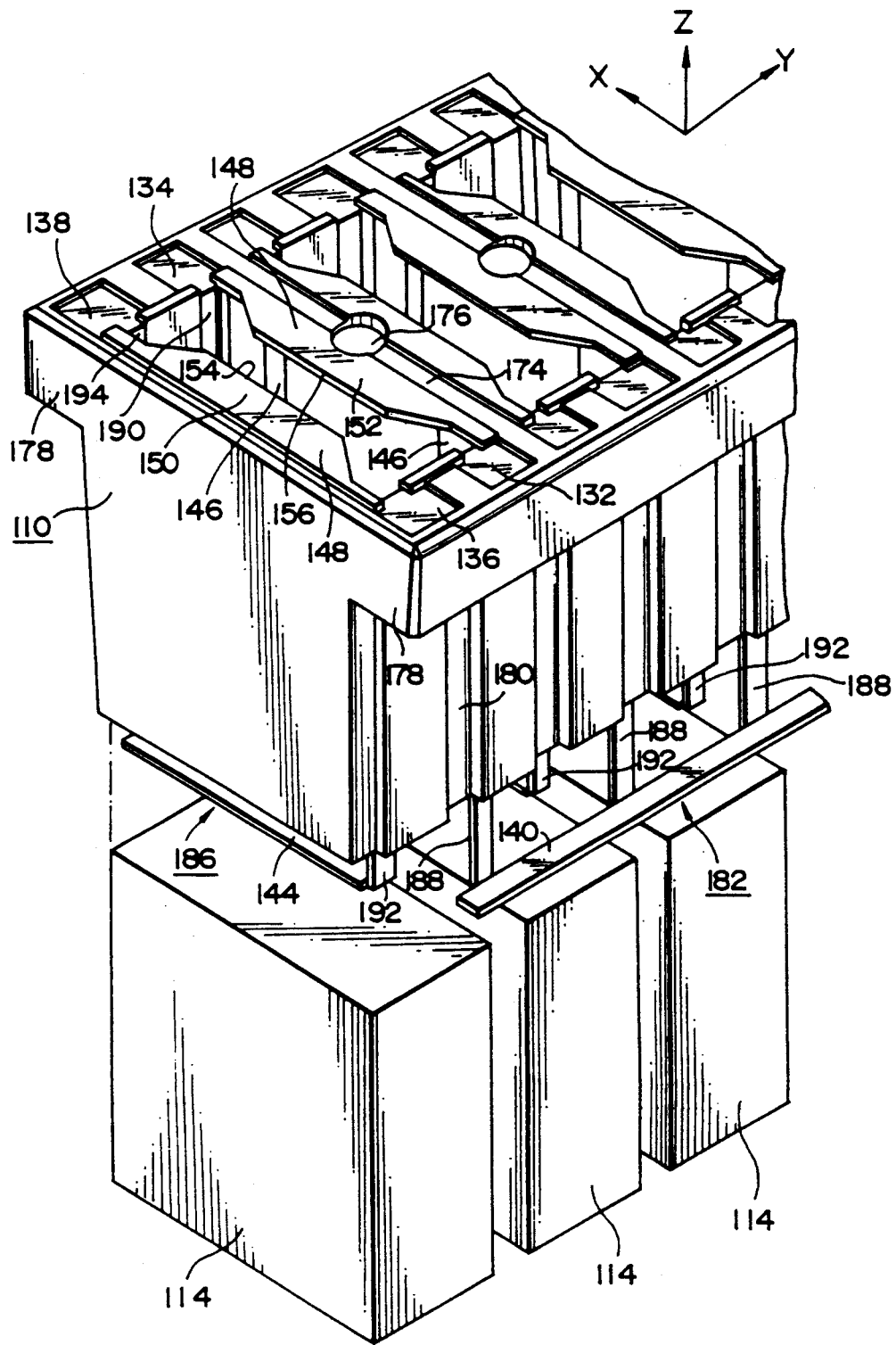
FIG. 6 is a cutaway perspective view of the stem with the comb terminals and the U-shaped terminals attached thereto as shown in FIG. 5, explaining the state in which the magnets are attached to the stem.

FIG. 6 is a cutaway perspective view of the stem 110 with the comb terminals 182, 184 and the U-shaped terminals 186 attached thereto as shown in FIG. 5, explaining the state in which magnets 114 are attached to the stem 110.

The magnet 114 for applying a magnetic field to the magnetic detector 116 is fitted into the stem 110 from the bottom portion thereof in such a manner as to come into contact with the top walls 148 and the guides 152 and 154, and bonded therewith by an adhesive or the like. The position in the direction of Y at which the magnet 114 is attached to the stem 110 is regulated by the partition walls 146. The surplus adhesive is discharged from the top wall groove 174 and the through hole 176.

Figure 7:
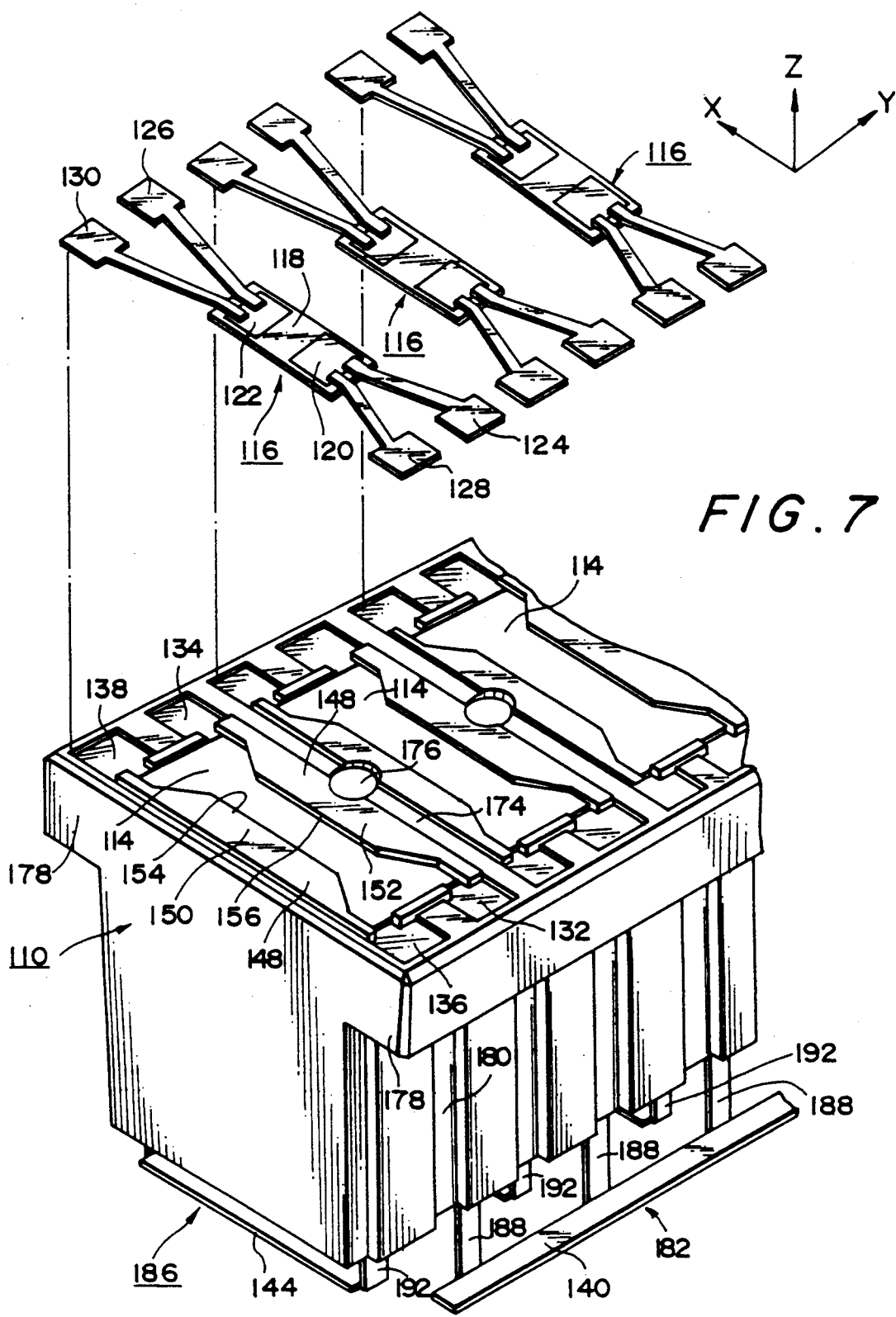
FIG. 7 is a cutaway perspective view of the stem shown in FIG. 6, showing the state in which a plurality of magnetic detectors are further attached thereto.

FIG. 7 is a cutaway perspective view of the stem 110 shown in FIG. 6, showing the state in which a plurality of magnetic detectors 116 are further attached thereto.

The magnetic detector 116 is composed of an element substrate 118, magnetoresistance elements 120, 122 composed of indium antimony or the like which are provided on the element substrate 118 and the resistance value of which varies when the magnetic field supplied from the magnet 114 is disturbed by a magnetic card or the like, and power source frame terminals 124, 126 and output frame terminals 128 and 130 which are lead from the magnetoresistance elements 120 and 122, respectively.

The magnetic detector 116 is bonded and secured to the top surface of the magnet 114 by an adhesive or the like. The position at which the magnetic detector 116 is secured to the magnet 114 is regulated in the direction of Y by the guides 150 and 152 and regulated in the direction of X by positioning the longitudinal sides of the magnetic detector 116 in strict conformity with the regulating sides 154 and 156 of the guides 150 and 152. In this way, the magnetic detector 116 is secured to the magnet 114 at a predetermined positional accuracy by virtue of the guides 150 and 152.

The power source frame terminals 124, 126 and the output frame terminals 128, 130 of the magnetic detector 116 are connected to the wider areas 132, 134 of the comb terminals 182 and 184 and the wider areas 136 and 138 of the U-shaped terminal 186, respectively, by bonding or the like. The connection is carried out such that the terminals 124, 126, 128 and 130 do not protrude from the stem 110 in the direction of Z after the connection. When the element substrate 118 of the magnet detector 116 are fitted into the gap between the guides 150 and 152 (guide gap), since the guides 150 and 152 are thicker than the magnetic detector 116, the magnetic detector 116 does not protrude from the guides 150 and 152 in the direction of Z. In this way, the magnet detector 116 is secured to the magnet 114 such that the frame terminals 124, 126, 128 and 130 of the magnetic detector 116 do not protrude from the surface on which the magnetic detector 116 is disposed, and the magnetoresistance elements 120 and 122 do not protrude from the surfaces of the guides 150 and 152.

The connection of the magnetic detector 116 and the output terminal by the comb terminals 182, 184 and the U-shaped terminal 186 will now be explained with reference to FIG. 8.

Figure 8:
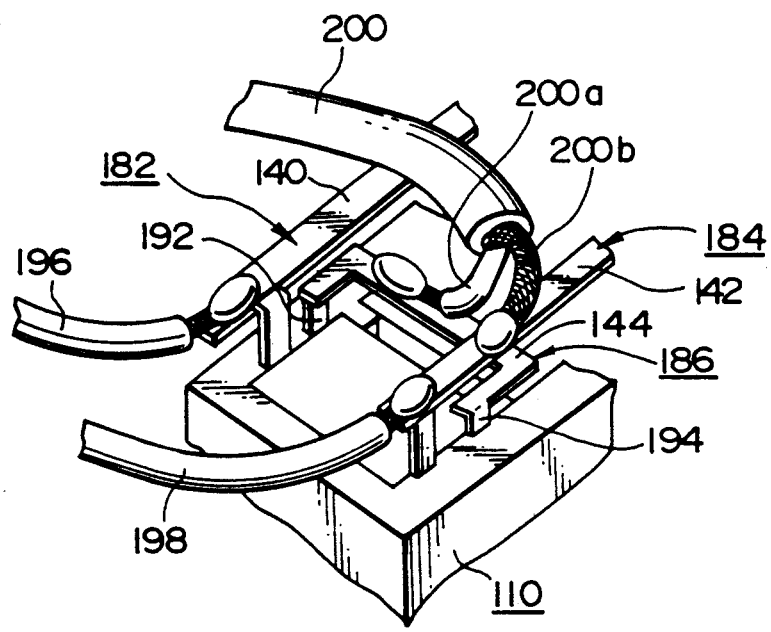
FIG. 8 shows the bottom surface of the stem shown in FIG. 6 in order to explain the connection between the comb terminals and the U-shaped terminals and the output terminal in the first embodiment.

In FIG. 8, lead wires 196 and 198 are connected to the comb terminals 182 and 184, respectively. The lead wire 196 is connected to the positive-side terminal of the power source, while the lead wire 198 is connected to the negative-side terminal thereof. To the U-shaped terminal 186 is connected the lead wire 200a of a single-core shielding wire 200, and a lead wire 200b of the single-core shielding wire 200 is connected to the comb terminal 184. That is, the magnetic detector 116 and the power source is connected to each other through the lead wires 196 and 198. An output signal is taken out of each channel through the single-core shielding wire 200.

Figure 9:
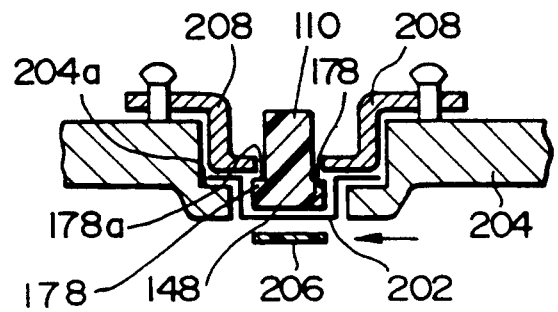
FIG. 9 is a sectional view of a magnetoresistance element array of the first embodiment, showing the state of being attached to an array holder.

The magnetoresistance element array according to the present invention having the above-described structure is covered with a metal cap 202 on the side of the top walls 148 of the stem 110 and is secured to an array holder 204, as shown in FIG. 9.

In this embodiment, the element substrate 118 is received by the gap between the guides 150, 152 in an embedded state, and the frame terminals 124, 126, 128 and 130 are similarly received by the terminal receiving recessed portions 166, 168, 170 and 172, respectively, in an embedded state. Therefore, when the stem 110 is covered with the metal cap 202, there is no possibility of the cap 202 causing short-circuit by coming into contact with the frame terminal 124, 126, 128 or 130, or pressing the magnetoresistance element 120 or 122 so as to produce a piezo effect, thereby exerting a deleterious influence on or damaging the element 120 or 122. In the case of covering the stem 110 with the metal cap 202, if the cap surface of the metal cap 202 is brought into contact with the top surface of the stem 110, it is possible to make the gap between the magnetoresistance elements 120 and 122 and the cap surface very small and stably maintain the minute gap. Accordingly, for example, when a magnetic card 206 is moved in parallel to the metal cap 202 (e.g., in the direction indicated by the arrow in FIG. 9) and a magnetic code is read from the magnetic dots on the magnetic card 206, the detection sensitivity of the magnetoresistance elements 120 and 122 are enhanced with high reliability.

When the stem 110 is secured to the array holder 204, the metal cap 202 covering the stem 110 is inserted into the FIG. 9. In this case, if the thickness $H_1$ of the overhang portion 178 of the stem 110 is substantially equal to the height $H_2$ of the end portion of the array holder 204, the back surface of the overhang portion 178 is flush with the cap surface on the retaining surface 204a of the array holder 204, thereby facilitating the securing operation.

The magnetoresistance element array of this embodiment has the following advantages.

(1) Due to the positional regulation of the magnetic detector 116 in the directions of X and Y, it is possible to prevent crosstalk or deviation in the reading timing at the time of reading a magnetic code.

(2) It is possible to connect between the magnetoresistance elements 120 and 122, or between the magnetoresistance element and the power source by the U-shaped terminal 186 and the comb terminals 182 and 184, respectively, with easiness and at a low cost.

(3) It is possible to keep the detecting sensitivity of the magnetoresistance element array constant by preventing the magnetic detector 116 from protruding from the surface of the stem 110 on which the magnetic detector 116 is disposed.

(4) By virtue of the overhang portion 178 and the positioning grooves 180, the position at which the magnetoresistance element array is secured to the array holder 204 is regulated.

Figure 10:
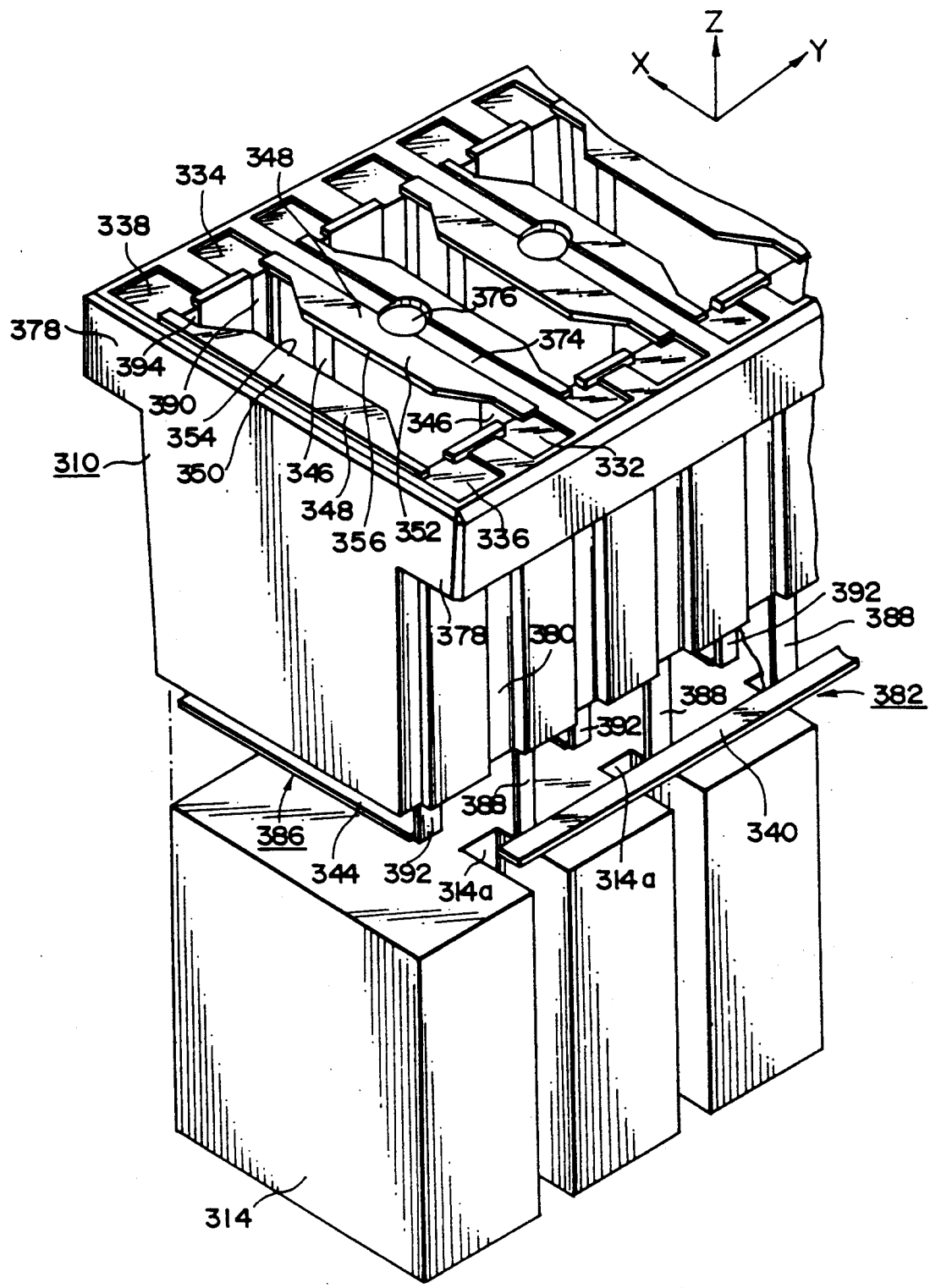
FIG. 10 is a cutaway perspective view of a stem used for a second embodiment of a magnetoresistance element array according to the present invention, showing the state in which a magnet having grooves on the side surfaces thereof is attached to the stem with comb terminals and U-shaped terminals are attached thereto.

FIG. 10 shows a stem 310 used for a second embodiment of a magnetoresistance element array according to the present invention, showing the state in which a magnet 314 is attached to the stem 310 with comb terminals 382 and 384 and U-shaped terminals 386.

In this embodiment, the magnet 314 is provided with grooves 314a on the side surfaces thereof which are engaged with the rib-like partition walls 346, thereby being held to the stem 310.

According to the magnetoresistance element array of this embodiment, not only are the advantages of the first embodiment offered but also the stem 314 is capable of holding the magnet 314 with higher reliability due to the engagement of the magnet 314 with the rib-like partitioned walls.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A magnetoresistance element array having a stem composed of a rectangular hollow casing with the interior thereof divided by partition walls, magnets inserted into said stem, magnetic detectors each of which is composed of a magnetoresistance element the resistance value of which varies in accordance with the magnetic field supplied from the outside, an element substrate with said magnetoresistance element provided on a part of the surface thereof, power source terminals and output terminals lead from said magnetoresistance element and external connecting terminals for connecting said power source terminals and said output terminals to the outside, said magnetoresistance element array comprising:

top walls each of which connects the side walls of said stem in the longitudinal direction like a bridge and the underside of which the top portions of said magnets are brought into close contact with; and
    guides which are formed from an opposing pair of said top walls in such a manner as to constitute a guide gap therebetween substantially equal to the width of each of said magnetic detectors and which have regulating sides for regulating the position at which each of said magnetic detectors is secured to the top portion of each of said magnets.

2. A magnetoresistance element array according to claim 1, wherein said regulating sides have a length substantially the same as the sides of said element substrate of said magnetic detector which are opposed to said regulating sides.

3. A magnetoresistance element array according to claim 1, wherein the thickness of said guides is larger than the thickness of said magnetic detector.

4. A magnetoresistance element array according to claim 2, wherein the thickness of said guides is larger than the thickness of said magnetic detector.

5. A magnetoresistance element array according to claim 1, wherein said stem is provided with overhang portions which project from the outer side walls of said stem and which have the same thickness as an array holder to which said stem is secured.

6. A magnetoresistance element array according to claim 1, wherein said stem is provided with positioning grooves which regulate the positions at which said stem is fixed to an array holder.

7. A magnetoresistance element array according to claim 1, wherein said magnets are bonded to said stem by an adhesive, and said top walls are provided with top wall grooves and through holes for discharging surplus adhesive therethrough.

8. A magnetoresistance element array according to claim 1, wherein said partition walls protrude from the inner side walls of said stem like ribs, and said magnet is provided with grooves on the side walls thereof which are engageable with said partition walls so as to be engaged with the rib-like walls.

9. A magnetoresistance element array having a stem composed of a rectangular box-shaped casing with the bottom portion thereof open and the interior thereof divided by partition walls, magnets inserted into said stem, magnetic detectors each of which is composed of a pair of magnetoresistance elements the resistance value of which varies in accordance with the magnetic field supplied from the outside, an element substrate with said magnetoresistance elements provided on a part of the surface thereof, and a power source terminal and an output terminal lead from each of said magnetoresistance elements, said magnetoresistance element array comprising:

a pair of comb terminals each of which has a plurality of leg portions and a handle portion for connecting said leg portions and which are disposed along the two side walls of said stem and connected to the power source terminals of said magnetic detectors so as to connected said power source terminals of said magnetic detectors to the external power source in parallel to each other;
    a plurality of U-shaped terminals disposed along said partition walls and connected to the output terminals of said magnetoresistance elements formed on each of said magnetic detectors so as to output the detected values of said magnetic detectors to the outside;
    terminal receiving grooves provided on said two side walls of said stem for receiving said comb terminals and said U-shaped terminals; and
    terminal receiving recessed portions provided on said stem for receiving the wider areas of said comb terminals and said U-shaped terminals which are connected to the power source terminals and the output terminals, respectively, of said magnetoresistance elements.

10. A magnetoresistance element array according to claim 9, further comprising top walls each of which protrudes from said partition walls of said stem in such a manner as to connect the side walls of said stem in the longitudinal direction like a bridge and the underside of which the top portions of said magnets are brought into close contact with; and guides which are formed from an opposing pair of said top walls in such a manner as to constitute a guide gap therebetween substantially equal to the width of each of said magnetic detectors and which have regulating sides for regulating the position at which each of said magnet detectors is secured to the top portion of each of said magnets.

11. A magnetoresistance element array according to claim 10, wherein said regulating sides have a length substantially the same as the sides of said element substrate of said magnetic detector which are opposed to said regulating sides.

12. A magnetoresistance element array according to claim 10, wherein the thickness of said guides is larger than the thickness of said magnetic detector.

13. A magnetoresistance element array according to claim 11, wherein the thickness of said guides is larger than the thickness of said magnetic detector.

14. A magnetoresistance element array according to claim 9, wherein said stem is provided with overhang portions which project from the outer side walls of said stem and which have the same thickness as an array holder to which said stem is secured.

15. A magnetoresistance element array according to claim 9, wherein said stem is provided with positioning grooves which regulate the positions at which said stem is fixed to an array holder.

16. A magnetoresistance element array according to claim 9, wherein said magnets are bonded to said stem by an adhesive, and said top walls are provided with top wall grooves and through holes for discharging surplus adhesive therethrough.

17. A magnetoresistance element array according to claim 9, wherein said power terminals and said output terminals of said magnetic detectors constitute frame leads and the lead-out ends of said power source terminals and said output terminals which are connected to said comb terminals and said U-shaped terminals, respectively, are positioned at said terminal receiving recessed portions.

18. A magnetoresistance element array having a stem composed of a rectangular box-shaped casing with the bottom portion thereof open and the interior thereof divided by partition walls, a magnet inserted into said stem, magnetic detectors each of which is composed of a pair of magnetoresistance elements the resistance value of which varies in accordance with the magnetic field supplied from the outside, an element substrate with said magnetoresistance elements provided on a part of the surface thereof, and a power source terminal and an output terminal lead from each of said magnetoresistance elements, said magnetoresistance element array comprising:

top walls each of which protrudes from said partition walls of said stem in such a manner as to connect the side walls of said stem in the longitudinal direction like a bridge and the underside of which the top portions of said magnet is brought into close contact with;

guides which are formed from an opposing pair of said top walls in such a manner as to constitute a guide gap therebetween substantially equal to the width of each of said magnetic detectors, which have a larger thickness than said magnetic detector and which have regulating sides for regulating the position at which each of said magnetic detectors is secured to the top portion of said magnet, said regulating sides having a length substantially the same as the sides of said element substrate of said magnetic detector which are opposed to said regulating sides;

top wall grooves and through holes provided on said top walls for discharging surplus portion of an adhesive therethrough which is used for bonding said magnet to said stem;

a pair of comb terminals each of which has a plurality of leg portions and a handle portion for connecting said leg portions and which are disposed along the two side walls of said stem and connected to the power source terminals of said magnetic detectors so as to connected said power source terminals of said magnetic detectors to the external power source in parallel to each other;

a plurality of U-shaped terminals disposed along said partition walls and connected to the output terminals of said magnetoresistance elements formed on each of said magnetic detectors so as to output the detected values of said magnetic detectors to the outside;

terminal receiving grooves provided on said two side walls of said stem for receiving said comb terminals and said U-shaped terminals;

terminal receiving recessed portions provided on said stem for receiving the wider areas of said comb terminals and said U-shaped terminals which are connected to the power source terminals and the output terminals, respectively, of said magnetoresistance elements, said power terminals and said output terminals of said magnetic detectors constituting frame leads and the lead-out ends of said power source terminals and said output terminals which are connected to said comb terminals and said U-shaped terminals, respectively, being positioned at said terminal receiving recessed portions;

overhang portions which project from the outer side walls of said stem and which have the same thickness as an array holder to which said stem is secured; and positioning grooves provided on said outer walls of said stem for regulating the positions at which said stem is fixed to said array holder;

said partition walls protruding from the inner walls of said stem like ribs, and said magnet being provided with grooves on the side walls thereof which are engageable with said partition walls so as to be engaged with the rib-like walls.

* * * * *